(12) United States Patent
Wang et al.

(10) Patent No.: US 10,827,282 B2
(45) Date of Patent: *Nov. 3, 2020

(54) TERMINAL ASSEMBLY STRUCTURE OF MEMS MICROPHONE

(71) Applicant: AAC Acoustic Technologies (Shenzhen) Co., Ltd., Shenzhen (CN)

(72) Inventors: Kai Wang, Shenzhen (CN); Hu Chen, Shenzhen (CN)

(73) Assignee: AAC Acoustic Technologies (Shenzhen) Co., Ltd., Shenzhen, Guangdong (CN)

(*) Notice: Subject to any disclaimer, the term of this patent is extended or adjusted under 35 U.S.C. 154(b) by 0 days.

This patent is subject to a terminal disclaimer.

(21) Appl. No.: 16/524,166

(22) Filed: Jul. 29, 2019

(65) Prior Publication Data

US 2020/0045476 A1 Feb. 6, 2020

(30) Foreign Application Priority Data

Aug. 2, 2018 (CN) .................... 2018 2 1246643 U

(51) Int. Cl.
*H04R 19/04* (2006.01)
*B81B 7/00* (2006.01)
(Continued)

(52) U.S. Cl.
CPC ........... *H04R 19/04* (2013.01); *B81B 7/0006* (2013.01); *H01L 24/48* (2013.01); *H04R 1/04* (2013.01);
(Continued)

(58) Field of Classification Search
CPC ........ H04R 19/04; H04R 19/005; H04R 1/04; H04R 2201/003; H04R 2499/11; B81B 7/0006; B81B 2201/0257; B81B 2207/07; H01L 2224/45144; H01L 2224/48155; H01L 24/48
See application file for complete search history.

(56) References Cited

U.S. PATENT DOCUMENTS

2013/0028450 A1* 1/2013 Cortese ................. B81B 7/0064
381/174
2014/0161289 A1* 6/2014 Pan ........................ H04R 19/04
381/174

(Continued)

*Primary Examiner* — Jason R Kurr
(74) *Attorney, Agent, or Firm* — W&G Law Group LLP

(57) ABSTRACT

The present disclosure provides a terminal assembly structure of a MEMS microphone, including a signal let out board disposed at a terminal and a silicon microphone disposed on the signal let out board. The silicon microphone includes a housing, a substrate forming an accommodation space with the housing, an MEMS chip and a waterproof member. The substrate is configured with a sound inlet connected to the outside. The waterproof member is sandwiched between the MEMS chip and the substrate. A position where the signal let out board corresponds to the silicon microphone is configured with an accommodation hole. The housing is accommodated in the accommodation hole. The substrate abuts a surface of the signal let out board and covers the accommodation hole. A surface of the substrate where the housing is assembled, is provided with at least one pad electrically connected with the signal let out board.

8 Claims, 3 Drawing Sheets

(51) Int. Cl.
*H01L 23/00* (2006.01)
*H04R 19/00* (2006.01)
*H04R 1/04* (2006.01)

(52) U.S. Cl.
CPC .... *H04R 19/005* (2013.01); *B81B 2201/0257* (2013.01); *B81B 2207/07* (2013.01); *H01L 2224/45144* (2013.01); *H01L 2224/48155* (2013.01); *H04R 2201/003* (2013.01)

(56) References Cited

U.S. PATENT DOCUMENTS

| | | | | |
|---|---|---|---|---|
| 2017/0121173 | A1* | 5/2017 | Hoekstra | H04R 1/04 |
| 2017/0283246 | A1* | 10/2017 | Elian | B81C 1/00277 |
| 2018/0091881 | A1* | 3/2018 | Evans | H04R 1/08 |
| 2018/0302726 | A1* | 10/2018 | Koymen | H04R 19/005 |

\* cited by examiner

US 10,827,282 B2

TERMINAL ASSEMBLY STRUCTURE OF MEMS MICROPHONE

TECHNICAL FIELD

The present disclosure relates to the field of electroacoustic transduction technology, and particularly relates to an MEMS microphone applied to a mobile electronic device.

BACKGROUND

With rapid development of the mobile communication technology in recent years, mobile communication devices such as portable phones, portable phones capable of accessing Internet, personal digital assistants and other devices that perform communication specially utilizing communication networks are used more and more. A microphone, especially a MEMS microphone, is one of the most important units used in the above-described devices.

A micro-electro-mechanical system (MEMS) microphone is an electroacoustic transducer produced by micro-mechanical technology, with small volume, excellent frequency response characteristic, low noise and the like. As electronic devices are getting miniaturized, lightened and thinned, MEMS microphones are increasingly widely used in those devices.

A terminal assembly structure of a MEMS microphone in a related art, generally configures a soldering pad by screen printing on a surface of a substrate opposite to a surface which is provided with a silicon microphone. A silicon microphone with such structure can be directly adhered onto a signal let out board of a smart terminal device, after being adhered to the pad by solder paste. In this way, the overall thickness of the terminal device of the MEMS microphone becomes thicker because of the thickness of the silicon microphone. Besides, since a silicon microphone has no waterproof function, the silicon microphone will stop working because of short-circuit once water enters the device.

Therefore, it is necessary to provide a new terminal assembly structure of a MEMS microphone to solve the above-described drawback.

BRIEF DESCRIPTION OF THE DRAWINGS

In order to describe technical solutions in the embodiments of the present disclosure more clearly, accompany drawings used to describe the embodiments are briefly illustrated below. It is evident that the drawings in the following description are only some embodiments of the present disclosure. For those skilled in the art, in a case where no inventive effort is made, other drawings may be obtained according to these drawings.

DETAILED DESCRIPTION

The technical solutions in embodiments of the present disclosure will be clearly and completely described with reference to the accompany drawings of the present disclosure. It is evident that the embodiments described are only some rather than all embodiments of the present disclosure. Based on the embodiments of the present disclosure, all other embodiments obtained by skilled persons in the art without making any inventive effort fall into the disclosure of protection by the present disclosure.

Figure 1:
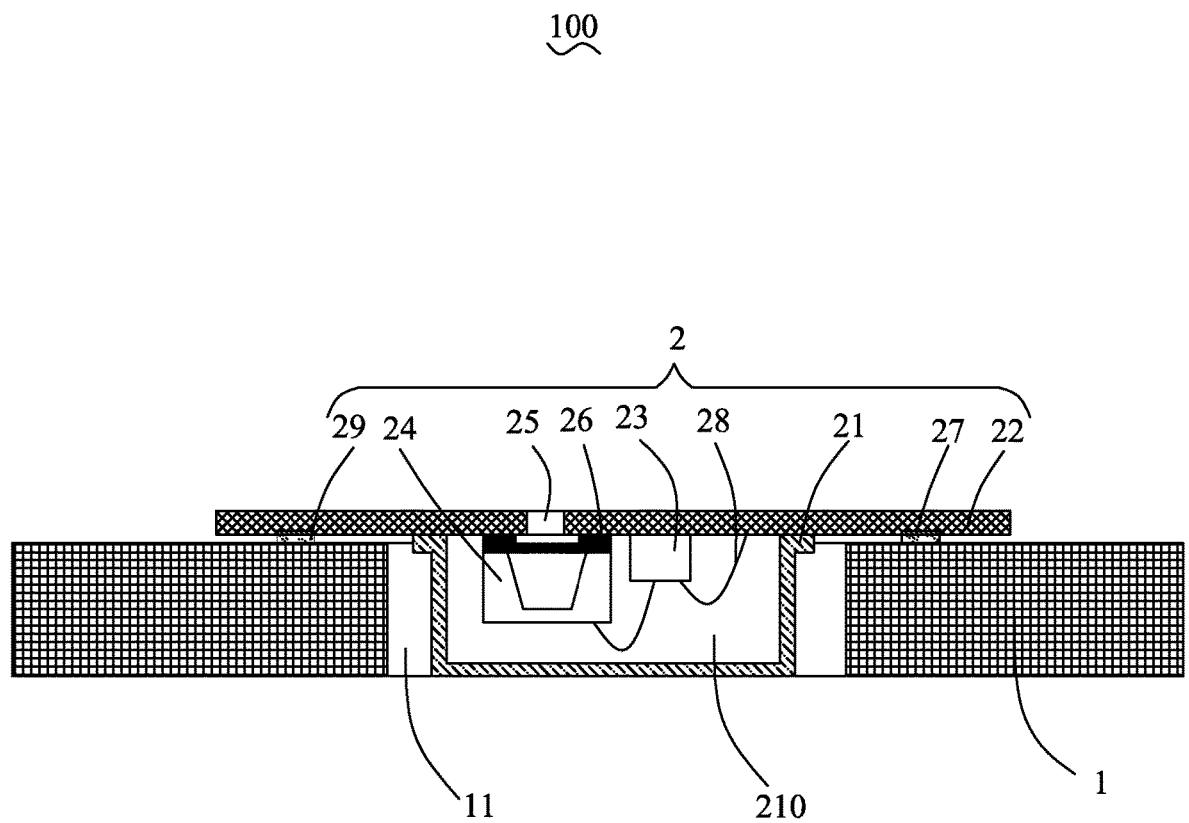
FIG. 1 is a structural view of a terminal assembly structure of a MEMS microphone provided in the present disclosure.
Figure 2:
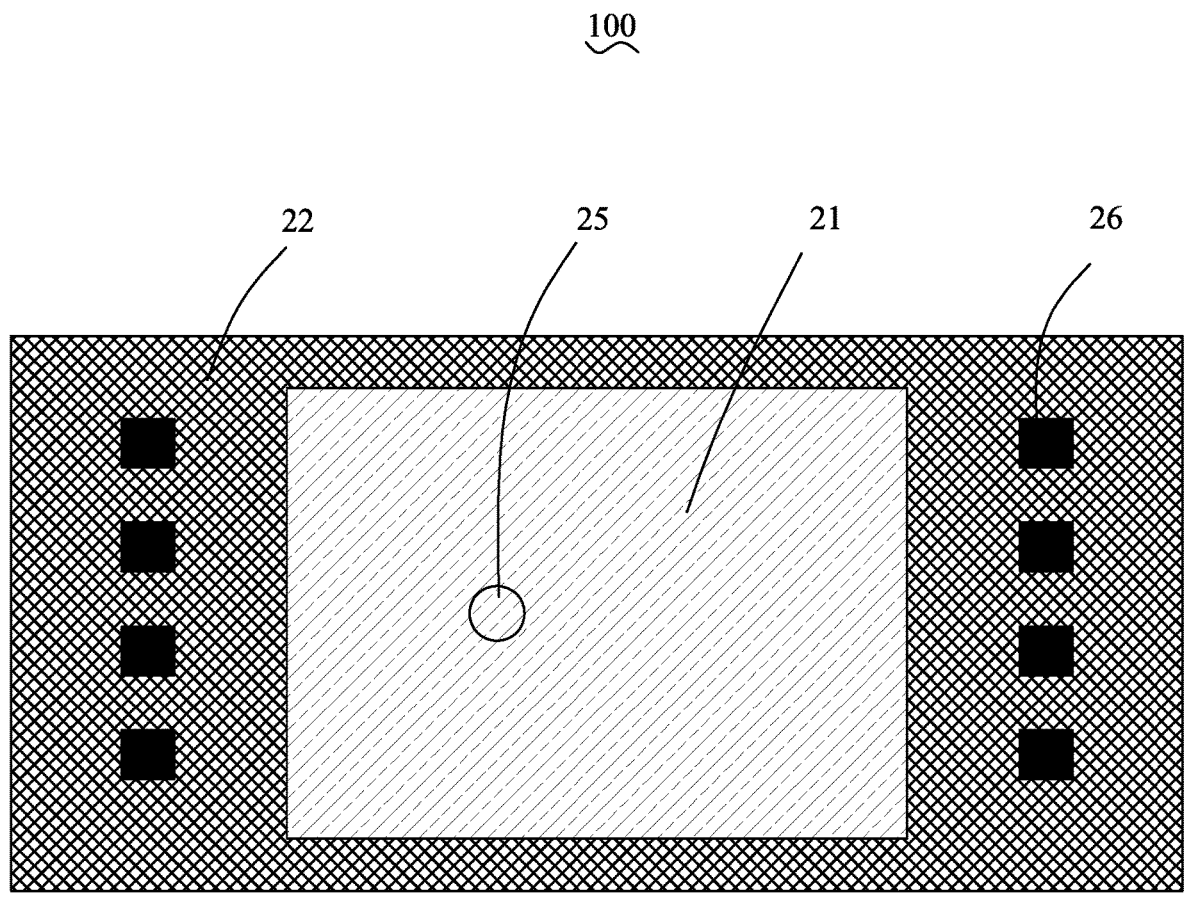
FIG. 2 is a top view of the terminal assembly structure of the MEMS microphone provided in the present disclosure.

With reference to FIG. 1 and FIG. 2, FIG. 1 is a structural view of a terminal assembly structure of a MEMS microphone provided in the present disclosure, and FIG. 2 is a top view of the terminal assembly structure of the MEMS microphone provided in the present disclosure. The present disclosure provides a terminal assembly structure 100 of a MEMS microphone including a signal let out board 1 and a silicon microphone 2. The signal let out board 1 is configured with an accommodation hole 11. The silicon microphone 2 includes a housing 21, a substrate 22, an ASIC chip 23, a MEMS chip 24, a sound inlet 25, a waterproof member 26, at least one pad 27, a gold wire 28 and solder paste 29.

The signal let out board 1 is disposed at a terminal, and the silicon microphone 2 is disposed on the signal let out board 1.

The housing 21 and the substrate 22 form an accommodation space 210. The housing 21 is a metal housing, and the substrate 22 is a printed circuit board.

The ASIC chip 23 and the MEMS chip 24 are accommodated in the accommodation space 210.

The ASIC chip 23 is electrically connected to the substrate 22, and the ASIC chip 23 and the MEMS chip 24 are electrically connected. Specifically, the ASIC chip 23 is electrically connected to the substrate 22 through a gold wire 28, and the ASIC chip 23 is electrically connected to the MEMS chip 24 through a gold wire 28.

The sound inlet 25 is configured at a position of the substrate 22 corresponding to the MEMS chip 24, and communicated to outside.

The waterproof member 26 is accommodated in the accommodating space 210 and covers the sound inlet 25, the waterproof member 26 being sandwiched between the MEMS chip 24 and the substrate 22, the waterproof member 26 connecting the MEMS chip 24 and the substrate 22.

The waterproof member 26 is a mesh component with waterproof and dustproof function, and formed between the substrate 22 and the MEMS chip 24 through semiconductor mounting process. A material for the waterproof member 26 may be a high temperature resistant silicon chip, or a high impact drop resistant poly tetra fluoro ethylene (PTFE) film.

The at least one pad 27 are disposed on a surface of the substrate 22 where the housing 21 is disposed. The at least one pad 27 is electrically connected to the signal let out board 1. Specifically, the at least one pad 27 can be adhered to the signal let out board 1 by the solder paste 29.

In this embodiment, there are a plurality of pad 27 which are is disposed at both sides of the housing 21, and aligned along the length direction of edges of the two sides of the housing 21.

The accommodation hole 11 is configured at a position of the signal let out board 1 corresponds to the silicon microphone 1. The housing 21 is accommodated in the accommodation hole 11, and the substrate 22 abuts a surface of the signal let out board 1 and covers the accommodation hole 11.

The accommodation hole 11 is a through hole or a blind hole, configured to accommodate the housing 21.

Figure 3:
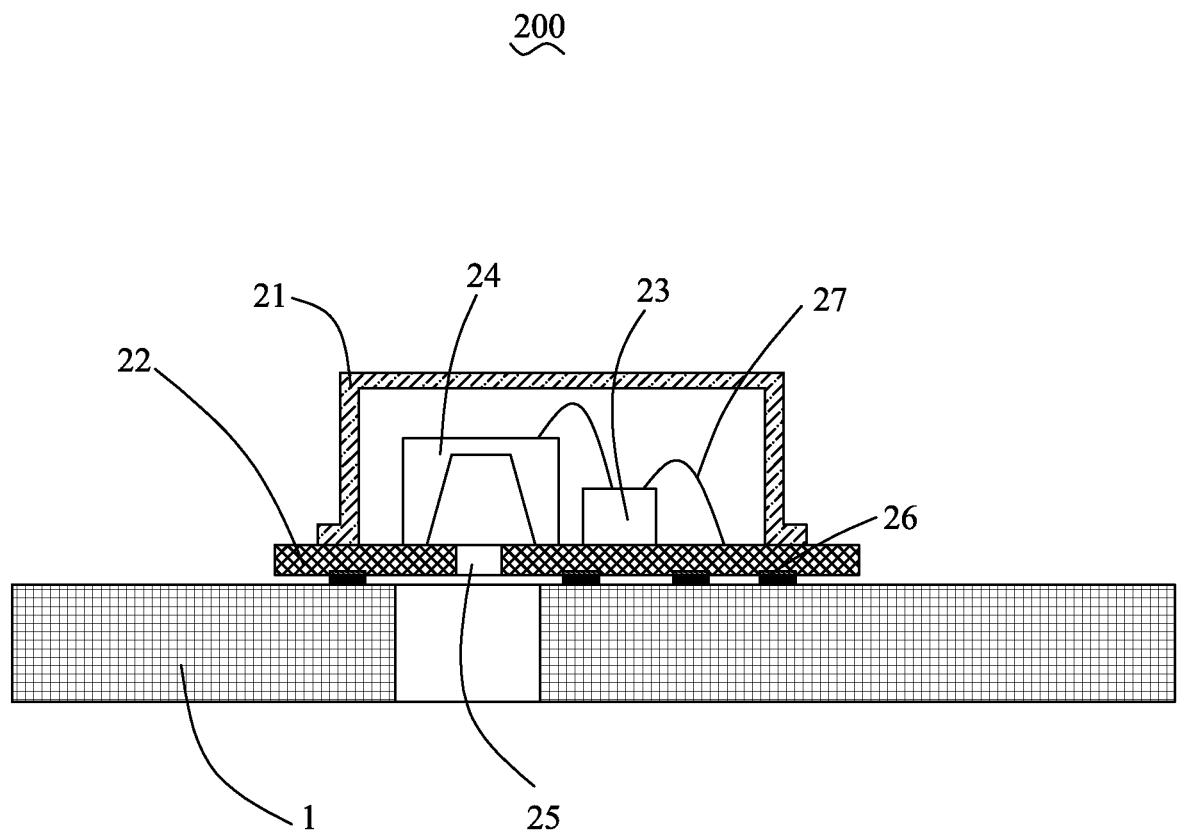
FIG. 3 is a structural view of a terminal assembly structure of a MEMS microphone provided in a related art.

With reference to FIG. 1 and FIG. 3, FIG. 1 is a structural view of a terminal assembly structure of a MEMS microphone provided in the present disclosure, and FIG. 3 is a structural view of a terminal assembly structure of a MEMS microphone provided in a related art. A terminal assembly structure 200 of a MEMS microphone in a related art is distinguished from the terminal assembly structure of a MEMS microphone provided in the present disclosure in: 1. the position of the housing 21 is different, and the housing 21 is not disposed in the accommodation hole 11 of the signal let out board 1 in the related art; 2. the position of the pads 27 are different, and the pads 27 are not disposed on the same surface of the substrate 22 with the housing 21 in the related art; 3. there is no waterproof member 26 as described above is disposed to cover the sound inlet 25 of the silicon microphone 2 in the related art.

Compared with the related art, the terminal assembly structure of the MEMS microphone provided in the present disclosure has the following advantages:

(1) Due to that a pad and a housing are disposed on the same surface of a substrate, substrate processing and package testing of the silicon microphone applied in the present disclosure are universal in existing processing with no bottleneck, thereby the terminal assembly structure of present disclosure can be mass produced and marketed with no delay;

(2) Due to that a silicon microphone with such structure can be directly adhered onto a signal let out board of a terminal device after being adhered to the pad by solder paste, it ensures that a sound inlet of the silicon microphone is directly opposite to a sound hole of the signal board, so that sound can be directly transmitted into the silicon microphone without loss;

(3) Due to that a silicon microphone with such structure can be adhered onto a signal let out board of a terminal device after being adhered to the pad by solder paste, the silicon microphone is embedded inside the signal let out board, which can reduce the overall height of the silicon microphone and signal let out board to the utmost and ensure that the smart terminal device is characterized by being even thinner.

(4) Due to that a waterproof member between the substrate and the MEMS chip is added by the bonding process, waterproof and dustproof capabilities of the silicon microphone can be greatly improved, and application range of an existing silicon microphone is greatly extended.

The above-described are only embodiments of the present disclosure. It shall be noted that skilled persons in the related art may make improvements without departing from the concept of the present disclosure. All these improvements fall into the protection scope of the present disclosure.

What is claimed is:

1. A terminal assembly structure of a MEMS (Microelectro Mechanical System) microphone, comprising: a signal let out board disposed on a terminal and a silicon microphone disposed on the signal let out board, the silicon microphone comprising a housing, a substrate which forms an accommodation space cooperatively with the housing, an ASIC (Application Specific Integrated Circuit) chip and an MEMS chip both accommodated in the accommodation space, the ASIC chip being electrically connected to the substrate, the ASIC chip being electrically connected to the MEMS chip, a sound inlet communicated to outside of the MEMS microphone is configured at a position of the substrate corresponding to the MEMS chip, wherein the silicon microphone further comprises a waterproof member accommodated in the accommodating space and covering the sound inlet, the waterproof member is sandwiched between the MEMS chip and the substrate, an accommodation hole is configured at a position of the signal let out board corresponding to the silicon microphone, the housing is accommodated in the accommodation hole, the substrate abuts a surface of the signal let out board and covers the accommodation hole, at least one pad is configured on a surface of the substrate Where the housing is assembled, and the at least one pad is electrically connected to the signal let out board.

2. The terminal assembly structure of the MEMS microphone according to claim 1, wherein the waterproof member has a mesh structure.

3. The terminal assembly structure of the MEMS microphone according to claim 2, wherein the waterproof member is a silicon chip.

4. The terminal assembly structure of the MEMS microphone according to claim 2, wherein the waterproof member is a poly tetra fluoro ethylene (PTFE) film.

5. The terminal assembly structure of the MEMS microphone according to claim 1, wherein a plurality of pads are configured on the surface of the substrate, the plurality of pads are disposed at both sides of the housing, and aligned along the length direction of edges of the two sides of the housing.

6. The terminal assembly structure of the MEMS microphone according to claim 1, wherein the ASIC chip is electrically connected to the substrate by a gold wire, and the ASCI chip is electrically connected to the MEMS chip by a gold wire.

7. The terminal assembly structure of the MEMS microphone according to claim 1, wherein the substrate is a printed circuit board.

8. The terminal assembly structure of the MEMS microphone according to claim 1, wherein the housing is a metal housing.

* * * * *